(12) United States Patent
Mair et al.

(10) Patent No.: US 6,633,243 B2
(45) Date of Patent: *Oct. 14, 2003

(54) METHOD OF ENCODING VIDEO DATA FOR SERIAL TRANSMISSION

(75) Inventors: Hugh Mair, Fairview, TX (US); Gordon Gammie, Plano, TX (US); Steve Clynes, Allen, TX (US); Rolf Lagerquist, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 7 days.

This patent is subject to a terminal disclaimer.

(21) Appl. No.: 09/953,803

(22) Filed: Sep. 17, 2001

(65) Prior Publication Data

US 2003/0002585 A1 Jan. 2, 2003

Related U.S. Application Data

(60) Provisional application No. 60/313,194, filed on Aug. 17, 2001, and provisional application No. 60/296,924, filed on Aug. 17, 2001.

(51) Int. Cl.$^7$ ................................................ H03M 7/00
(52) U.S. Cl. ......................................... 341/50; 348/469
(58) Field of Search ............................. 348/469, 240.2, 348/241, 390.1; 360/39; 386/114; 341/50, 51, 58, 102; 709/231; 370/468

(56) References Cited

U.S. PATENT DOCUMENTS

| | | | | |
|---|---|---|---|---|
| 4,835,607 A | * | 5/1989 | Keith | 348/390.1 |
| 5,974,464 A | * | 10/1999 | Shin et al. | 709/231 |
| 6,151,334 A | * | 11/2000 | Kim et al. | 370/468 |
| 6,323,789 B1 | * | 11/2001 | Lawrence | 341/102 |

\* cited by examiner

*Primary Examiner*—Jean Bruner Jeanglaude

(57) ABSTRACT

An encoding scheme simplifies the TMDS encoding algorithm described in the DVI 1.0 specification while retaining compatibility with most existing DVI receivers. The generation of the Transition Control bit has been removed; and although the INV bit has a similar function to the DC bit in the DVI 1.0 standard, the algorithm for deriving it is very different. No attempt is made to maintain a DC balance on the cable. Instead, the INV bit is set to a '1' for the purpose of removing 'rogue' character sequences; otherwise it is always set to a '0'.

13 Claims, 1 Drawing Sheet

$$S0 = D0 \wedge INV$$
$$S1 = D1 \wedge S0 \wedge INV$$
$$S2 = D2 \wedge S1 \wedge INV$$
$$S3 = D3 \wedge S2 \wedge INV$$
$$S4 = D4 \wedge S3 \wedge INV$$
$$S5 = D5 \wedge S4 \wedge INV$$
$$S6 = D6 \wedge S5 \wedge INV$$
$$S7 = D7 \wedge S6 \wedge INV$$
$$S8 = 1$$
$$S9 = INV$$

S0 = D0^INV
S1 = D1^S0^INV
S2 = D2^S1^INV
S3 = D3^S2^INV
S4 = D4^S3^INV
S5 = D5^S4^INV
S6 = D6^S5^INV
S7 = D7^S6^INV
S8 = 1
S9 = INV

METHOD OF ENCODING VIDEO DATA FOR SERIAL TRANSMISSION

RELATED PATENT APPLICATIONS

This application claims priority under 35 Usc §119 (e)(1) of Provisional Application No. 60/313,194, filed Aug. 17, 2001.

This application is related to co-pending U.S. patent application Ser. No. 60/296,924, entitled *Method For Adding Additional Data To A Communication Link While Retaining Backward Compatibility*, filed on Jun. 8, 2001 and co-pending U.S. Patent Application entitled *New Encoding Algorithm Providing Compatibility With a Class of DVI Receivers*, filed on Aug. 17, 2001.

BACKGROUND OF THE INVENTION

1. Field of the Invention

This invention relates generally to data encoding, and more particularly to video data encoding algorithms providing compatibility with a class of digital visual interface (DVI) receivers.

2. Description of the Prior Art

The Digital Visual Interface Specification, Revision 1.0 (DVI 1.0), published by the Digital Display Working Group (DDWG) describes an encoding scheme that should be used for transmission of video data across an interconnecting cable in a compliant system. The DVI 1.0 encoding algorithm involves the expansion of 8-bit video data to a 10-bit serial word. During active video times, the video data is encoding, and during inactive video times, two binary signals are encoded. On one channel, for example, these two binary signals are used to represent horizontal and vertical synchronizing signals. For active video, the input word is denoted as D0 through D7 (D0 is the LSB). The serial word is denoted S0 through S9 (where S0 is the LSB and the first bit to be sent). The algorithm is defined as:

S0=D0^DC

S1=D1^S0^TC^DC

S2=D2^S1^TC^DC

S3=D3^S2^TC^DC

S4=D4^S3^TC^DC

S5=D5^S4^TC^DC

S6=D6^S5^TC^DC

S7=D7^S6^TC^DC

S8=TC^1

S9=DC where '^' is defined as an exclusive-OR operation, TC is a 'Transition Control' bit, and DC is a 'DC Balance Control' bit, as described in further detail herein below.

In order to be able to identify active video data from non-active video data, the inventors of the prior art algorithm set forth above identified the number of transitions within the 10-bit word as a key characteristic that could be detected. Furthermore, certain characters could be sent to uniquely identify the LSB/MSB positions within the serial data stream. In order to prevent the active video characters from being misinterpreted, the TC bit is used to reduce the number of transitions within an active data symbol.

EXAMPLE

Assume DC=0 (DC has a separate, independent function described herein below), with TC=0, a binary data symbol (LSB)11111111(MSB) would be first encoded as (LSB) 1010101010(MSB). Since the goal of the algorithm is to minimize the number of transitions for active data, the TC bit must be set (i.e. perform transition control), and hence the character would be fully encoded as (LSB)1111111100 (MSB).

Further, if one assumes that the preceding bit in the serial stream has a logic value of '1', it can be shown that all 8-bit input data can be encoded into a 10-bit code with fewer than six 0-to-1 or 1-to-0 transitions.

The DC Balance Control bit is used to optionally invert bits S0 through S7 in order to maintain a DC bias close to zero. The goal of the encoder is to transmit exactly the same number of ones and zeros over a period of time. The encoder keeps a running count of the number of ones and zeros that it has transmitted within the current active video period. If there is a disparity between the number of ones and the number of zeros that have been sent, the encoder will adjust the DC Balance Control bit to ensure that the current character, at worst, does not add to this disparity, and typically will cause the disparity to bias itself towards zero.

EXAMPLE

If the first active data symbol is (LSB)10000000(MSB), the encoder will transmit the serial code (LSB)1111111110 (MSB). This will accumulate a disparity of +8 (i.e. nine '1's and one '0' have been sent). If the second active data symbol is (LSB)01000000(MSB), the transmitter can send either (LSB)0111111110(MSB) or (LSB)1000000011(MSB). These two characters have individual disparities of +6 and −4 respectively. Since it is desirable to maintain a cumulative disparity close to zero, the second character must be sent; hence the cumulative disparity will become +4([+8]+ [−4]).

For the purpose of DVI 1.0, there are four synchronization characters that represent inactive video data. The particular value that should be sent depends on the state of the two additional binary signals that are transmitted during inactive video:

EXAMPLE (C1,C0)=(0,0): (LSB)0010101011(MSB)

(C1,C0)=(0,1): (LSB)1101010100(MSB)

(C1,C0)=(1,0): (LSB)0010101010(MSB)

(C1,C0)=(1,1): (LSB)1101010101(MSB)

In view of the foregoing, an encoding scheme that simplifies the TMDS encoding algorithm described in the DVI 1.0 specification while retaining compatibility with most existing DVI receivers would provide great advantages over the prior art.

SUMMARY OF THE INVENTION

The present invention is directed to an encoding scheme that simplifies the TMDS encoding algorithm described in the DVI 1.0 specification while retaining compatibility with most existing DVI receivers. The encoding scheme can be described as:

S0=D0^INV
S1=D1^S0^INV
S2=D2^S1^INV
S3=D3^S2^INV
S4=D4^S3^INV
S5=D5^S4^INV
S6=D6^S5^INV
S7=D7^S6^INV
S8=1
S9=INV

In one aspect of the invention, a digital visual interface encoding scheme is implemented without a Transition Control bit such that the number of transitions is not controlled and such that the active and non-active video cannot be separated based on the number of transitions while retaining compatibility with most existing DVI receivers.

In still another aspect of the invention, a digital visual interface encoding scheme is implemented such that a DC balance is not maintained on the associated cable while retaining compatibility with most existing DVI receivers.

In yet another aspect of the invention, a digital visual interface encoding scheme is implemented having the INV bit set to a '1' for the purpose of removing 'rogue' character sequences while retaining compatibility with most existing DVI receivers.

BRIEF DESCRIPTION OF THE DRAWINGS

Other aspects, features and advantages of the present invention will be readily appreciated as the invention becomes better understood by reference to the following detailed description when considered in connection with the accompanying drawings in which like reference numerals designate like parts throughout the figures thereof and wherein:

FIG. 1 illustrates the prior art (DVI 1.0) digital visual interface encoding algorithm; and FIG. 2 illustrates a digital visual interface encoding scheme according to one embodiment of the present invention.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The present embodiments are best understood by first reiterating a synopsis of the prior art set forth above. The Digital Visual Interface Specification, Revision 1.0 (DVI 1.0), as stated herein before, describes an encoding scheme that should be used for transmission of video data across an interconnecting cable in a compliant system. The DVI 1.0 encoding algorithm involves the expansion of 8-bit video data to a 10-bit serial word. During active video times, the video data is encoding, and during inactive video times, two binary signals are encoded. On one channel, for example, these two binary signals are used to represent horizontal and vertical synchronizing signals. For active video, the input word is denoted as D0 through D7 (D0 is the LSB). The serial word is denoted S0 through S9 (where S0 is the LSB and the first bit to be sent). The algorithm is illustrated in FIG. 1 as:

S0=D0^DC
S1=D1^S0^TC^DC
S2=D2^S1^TC^DC
S3=D3^S2^TC^DC
S4=D4^S3^TC^DC
S5=D5^S4^TC^DC
S6=D6^S5^TC^DC
S7=D7^S6^TC^DC
S8=TC^1
S9=DC where '^' is defined as an exclusive-OR operation, TC is a 'Transition Control' bit, and DC is a 'DC Balance Control' bit, as described in further detail herein below.

In order to be able to identify active video data from non-active video data, the inventors of the prior art algorithm set forth above identified the number of transitions within the 10-bit word as a key characteristic that could be detected. Furthermore, certain characters could be sent to uniquely identify the LSB/MSB positions within the serial data stream. In order to prevent the active video characters from being misinterpreted, the TC bit is used to reduce the number of transitions within an active data symbol. Further, if one assumes that the preceding bit in the serial stream has a logic value of '1', it can be shown that all 8-bit input data can be encoded into a 10-bit code with fewer than six 0-to-1 or 1-to-0 transitions.

The DC Balance Control bit is used to optionally invert bits S0 through S7 in order to maintain a DC bias close to zero. The goal of the encoder is to transmit exactly the same number of ones and zeros over a period of time. The encoder keeps a running count of the number of ones and zeros that it has transmitted within the current active video period. If there is a disparity between the number of ones and the number of zeros that have been sent, the encoder will adjust the DC Balance Control bit to ensure that the current character, at worst, does not add to this disparity, and typically will cause the disparity to bias itself towards zero.

FIG. 2 illustrates an encoding scheme that simplifies the TMDS encoding algorithm described in the DVI 1.0 specification and depicted in FIG. 1, discussed herein above, while retaining compatibility with most existing DVI receivers according to the best mode known by the present inventors. As seen in FIG. 2, the encoding algorithm can be described as:

S0=D0^INV
S1=D1^S0^INV
S2=D2^S1^INV
S3=D3^S2^INV
S4=D4^S3^INV
S5=D5^S4^INV

S6=D6^S5^INV

S7=D7^S6^INV

S8=1

S9=INV

It can also be seen that the generation of the TC (Transition Control) bit has been removed. The implication is that the number of transitions is not controlled; and hence the active and non-active video cannot be separated based on the number of transitions. Although the INV bit has a similar function to the DC bit in the DVI 1.0 standard, the algorithm for deriving it is very different. In the algorithm shown in FIG. 2, no attempt is made to maintain a DC balance on the cable. Instead, the INV bit is set to a '1' for the purpose of removing 'rogue' character sequences; it is set to a '0' at all other times. Rogue character sequences, as used herein, are defined in two ways as:

1) any character which generates a reserved synchronization character upon encoding, e.g, (LSB)00111111 (MSB) will encode as (LSB)0010101010(MSB); since this is synchronization character (1,0), the INV bit must be set to avoid sending a decodable synchronization character during active video. The encoded stream therefore appears as (LSB)1101010111(MSB) which is not a reserved character; or 2) a sequence of two adjacent synchronization characters appearing in any position across the span of three consecutive stream characters. The present inventors evaluated different DVI 1.0 receivers and found this criteria was used by most of the DVI 1.0 receivers that were evaluated to determine the LSB/MSB position. Two consecutive characters was determined to be significant since this causes an LSB/MSB realignment in the receiver and hence the second synchronization character is fully decoded. Generation of consecutive synchronization characters must therefore be avoided.

EXAMPLE (LSB)00000001(MSB), (LSB)01111110(MSB), (LSB) 11111100(MSB) would encode as serial stream: (LSB) 0000000110(MSB), (LSB)1010101110(MSB, (LSB) 1010100010(MSB). It can be seen that the synchronization characters 1101010101 and 1101010100 occur consecutively within the stream; hence this stream is illegal. The algorithm illustrated in FIG. 2 would implement the INV bit to generate the stream as: (LSB)0000000110(MSB), (LSB) 0101010011(MSB), (LSB)1010100010(MSB), which does not contain an illegal sequence.

The present inventors tested different brands of DVI 1.0 compliant receivers and found most of the brands correctly decoded the algorithm described herein above with reference to FIG. 2. A computer program source code written in the 'C' computer programming language and used to test the encoding algorithm shown in FIG. 2 is set forth in Appendix 'A' attached hereto. Specifically, the computer programs use sequences of random numbers to test for the effective removal of rogue characters that are the basis of the algorithm for controlling the 'INV' signal, and therefore are the basis for the validation of the algorithm set forth in FIG. 2. In summary explanation of the above, the present invention is directed to an encoding scheme that simplifies the TMDS encoding algorithm described in DVI 1.0, while retaining compatibility with most existing DVI receivers. The generation of the Transition Control bit has been removed; and although the INV bit has a similar function to the DC bit in the DVI 1.0 standard, the algorithm for deriving it is very different. In the present algorithm, no attempt is made to maintain a DC balance on the cable. Instead, the INV bit is set to a '1' for the purpose of removing 'rogue' character sequences; otherwise it is always set to a '0'.

This invention has been described in considerable detail in order to provide those skilled in the digital visual interface art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

Docket No.: TI-33399

Appendix A

Computer program source code written in the 'C' computer programming language and used to test the encoding algorithm shown in Figure 2

```c
#include <stdio.h>
include <stdlib.h> int control[4] = {0x354, 0x0ab, 0x154, 0x2ab}; //Control character
sequences
int error_count = 0;
int debug = 0;

//Return a pseudo random number between 0 and range-1
int random_int(int range)
{
  int temp;
  temp = ((int)(rand() * range)) / (RAND_MAX + 1);
  return temp;
}

//Print data in binary form for bit_count digits
void print_binary(int data, int bit_count)
{
  int counter;

for (counter = bit_count; counter>0; counter--)
  {
    if ((data & (1 << (counter - 1))) == 0)
      printf("0");
    else
      printf("1");
  }
}

//Return the state of bit 'bit' in data
int get_bit(int data, int bit)
{
  return (data >> bit) & 0x1;
}

//Generate a 9 bit code for the 8 bit data input, setting bit 8 to a 1
int d_to_qm(int data)
{
  int result;
  int qm[9];
  int loop;

qm[0] = get_bit(data,0);
  qm[1] = qm[0] ^ get_bit(data,1);
  qm[2] = qm[1] ^ get_bit(data,2);
```

Docket No.: TI-33399

```c
    qm[3] = qm[2] ^ get_bit(data,3);
    qm[4] = qm[3] ^ get_bit(data,4);
    qm[5] = qm[4] ^ get_bit(data,5);
    qm[6] = qm[5] ^ get_bit(data,6);
    qm[7] = qm[6] ^ get_bit(data,7);
    qm[8] = 1;

result = 0;
    for (loop = 0; loop<=8; loop++)
    {
      result = result | (qm[loop] << loop);
    }
    return result;
}

//Check the input bit pattern to see if it is actually a sync pattern
int is_sync(int pattern)
{
    int loop;

for (loop = 0; loop<4; loop++)
    {
      if (pattern == control[loop])
        return loop + 1;
    }
    return 0;
}

//Check across a 30 bit 3 character sequence for 2 consecutive syncs,
or a sync pattern as an input
int check_for_2_syncs(int q_out1, int q_out2, int q_out3)
{
    int compound;
    int position;
    int check1, check2;

//A single aligned sync is also a problem!!
    if (is_sync(q_out2))
      return 1;

//Combine all three patterns for easy shifting
    compound = q_out1 | (q_out2 << 10) | (q_out3 << 20);

for (position = 0; position <= 10; position ++)
    {
      check1 = compound & 0x3ff;
      check2 = (compound >> 10) & 0x3ff;

if (is_sync(check1) & is_sync(check2))
      {
        //Ooops, two syncs found
        return 1;
      }
      compound = compound >> 1;
    }
    return 0;
}
```

Docket No.: TI-33399

```c
//Calculate the balanced version of the input data
int set_balance_bit(int in_code)
{
  return 0x200 | (in_code & 0x100) | ((in_code & 0xff) ^ 0xff);
}

//Calculate what 10 bit value to send
int calc_tx_pattern(int new_data, int sending_sync)
{
  static int c1 = 0;
  static int c2 = 0;
  static int c3 = 0;
  static int c1_qm;
  static int c2_qm;
  static int c2_qm_balanced;
  static int c3_qm;
  static int c3_qm_balanced;
  static int e_00, e_01, e_10, e_11;
  static force_next = 0;
  static force_value = 0;
  int c2_out;
  int balance = 0;
  int sync_pattern_index;

//Delay characters
  c1 = c2;
  c2 = c3;
  if (sending_sync == 0)
    c3 = new_data;
  else
  {
    if (debug)
      printf("Sending Sync\n");
    sync_pattern_index = random_int(4);
    c3 = 0xcc0 + sync_pattern_index;
  }

//And calculate the tx patterns up to and including bit 8
  //If inversion control = 1 then actually do the inversion of the data
bits
  //which will keep compatability with Genesis etc...
  c2_qm = d_to_qm(c2);
  c3_qm = d_to_qm(c3);

//Calculate the balanced versions of c2 and c3 transmission patterns
  c2_qm_balanced = set_balance_bit(c2_qm);

//Calculate c3 transmission pattern based on whether this is a sync
or not.
  if (sending_sync == 1)
  {
    //If sending a sync, then can not change c3 code
    c3_qm = control[sync_pattern_index];
    c3_qm_balanced = control[sync_pattern_index];
  }
  else
```

Docket No.: TI-33399

```
  {
    c3_qm_balanced = set_balance_bit(c3_qm);
  }

//Calculate a set of flags which indicate whether the combinations of
balanced and unbalanced
  //versions of the current and next character will generate dual
syncs, or a single aligned sync.
  e_00 = check_for_2_syncs(c1_qm, c2_qm, c3_qm);
  e_01 = check_for_2_syncs(c1_qm, c2_qm, c3_qm_balanced);
  e_10 = check_for_2_syncs(c1_qm, c2_qm_balanced, c3_qm);
  e_11 = check_for_2_syncs(c1_qm, c2_qm_balanced, c3_qm_balanced);

if (debug)
  {
    printf("e_00 = %d e_01 = %d e_10 = %d e_11 = %d ", e_00, e_01,
e_10, e_11);
    printf("\nCHECK : "); print_binary(c3_qm, 10); printf("\n");
  }

//If we were forced last time, then do as we were told
  if (force_next == 1)
  {
    if (force_value == 1)
    {
      //We were told to force a 1 in the balance bit last time
      c2_out = c2_qm_balanced;
      balance = 1;
      //Check whether both cases for the NEXT character are safe
      if ((e_10 == 0) & (e_11 == 0))
      {
        //Both cases of next character are safe, so no need to force
        force_next = 0;
      }
      else if (e_10 == 0)
      {
        //Next needs to be forced to 0 to be safe
        force_next = 1;
        force_value = 0;
      }
      else if (e_11 == 0)
      {
        //Next needs to be forced to 1 to be safe
        force_next = 1;
        force_value = 1;
      }
      else
      {
        //Buggered!!
        printf("FATAL ERROR : Can't recover from previous force!!\n");
      }
    }
    else //Forced to a 0
    {
      //We were told to force a 0 in the balance bit last time
      c2_out = c2_qm;
      balance = 0;
```

```
      //Check whether both cases for the NEXT character are safe
      if ((e_00 == 0) & (e_01 == 0))
      {
        //Both cases of next character are safe, so no need to force
        force_next = 0;
      }
      else if (e_00 == 0)
      {
        //Next needs to be forced to 0 to be safe
        force_next = 1;
        force_value = 0;
      }
      else if (e_01 == 0)
      {
        //Next needs to be forced to 1 to be safe
        force_next = 1;
        force_value = 1;
      }
      else
      {
        //Buggered!!
        printf("FATAL ERROR : Can't recover from previous force!!\n");
      }
    }
  }
  else
  {
    //We were not forced last time, so can do what we want this time
    if ((e_00 == 0) & (e_01 == 0))
    {
      //Both the following options are available for a 0 balance of
this character, so use it
      c2_out = c2_qm;
      balance = 0;
    }
    else if ((e_10 == 0) & (e_11 == 0))
    {
      //If we balance this char then the following will have both
options, so use this
      c2_out = c2_qm_balanced;
      balance = 1;
    }
    //Don't have any options, so do what is necessary to ensure no dual
syncs
    else if (e_00 == 0)
    {
      c2_out = c2_qm;
      force_next = 1;
      force_value = 0;
      balance = 0;
    }
    else if (e_01 == 0)
    {
      c2_out = c2_qm;
      force_next = 1;
      force_value = 1;
      balance = 0;
```

Docket No.: TI-33399

```
    }
    else if (e_10 == 0)
    {
      c2_out = c2_qm_balanced;
      force_next = 1;
      force_value = 0;
      balance = 1;
    }
    else if (e_11 == 0)
    {
      c2_out = c2_qm_balanced;
      force_next = 1;
      force_value = 1;
      balance = 1;
    }
    else
      printf("OOPS!!! Reached somewhere we shouldn't have!!\n");
  } if (debug)
  {
    printf("\nCHECK : "); print_binary(c3_qm, 10); printf("\n");
    printf("balance = %d, force = %d, value = %d\n", balance,
force_next, force_value);
    printf("c3 = %x, c2 = %x, c1 = %x\n", c3, c2, c1);
    print_binary(c3_qm, 10); printf(" ");
    print_binary(c2_out, 10); printf(" ");
    print_binary(c1_qm, 10); printf("\n");
    print_binary(c3_qm_balanced, 10); printf(" ");
    print_binary(c2_out, 10); printf(" ");
    print_binary(c1_qm, 10); printf("\n");
  }
  //Delay the actual output pattern for later use
  c1_qm = c2_out;

return c2_out;
} int decode(int tx_pattern, int decode_method, int was_sync)
{
  int result, loop;
  int q[7];
  int b8;
  int dm_b;

//If decode_method = 0 then the algo is followed as for TMDS, ie do
data inversion.
  //If decode_method = 1 then b8 is ignored for inversion purposes
  //Do inversion based on what was the balance bit in TMDS
  if (get_bit(tx_pattern, 9) == 1)
    tx_pattern = (tx_pattern & 0x300) | ((tx_pattern & 0xff) ^ 0xff);

dm_b = decode_method ^ 1;

b8 = get_bit(tx_pattern, 8);
  if (b8 == 1)
  {
```

```
   q[0] = get_bit(tx_pattern, 0);
   q[1] = get_bit(tx_pattern, 1) ^ get_bit(tx_pattern, 0);
   q[2] = get_bit(tx_pattern, 2) ^ get_bit(tx_pattern, 1);
   q[3] = get_bit(tx_pattern, 3) ^ get_bit(tx_pattern, 2);
   q[4] = get_bit(tx_pattern, 4) ^ get_bit(tx_pattern, 3);
   q[5] = get_bit(tx_pattern, 5) ^ get_bit(tx_pattern, 4);
   q[6] = get_bit(tx_pattern, 6) ^ get_bit(tx_pattern, 5);
   q[7] = get_bit(tx_pattern, 7) ^ get_bit(tx_pattern, 6);
  }
  else //b8 == 0
  {
   q[0] = get_bit(tx_pattern, 0);
   q[1] = (get_bit(tx_pattern, 1) ^ get_bit(tx_pattern, 0)) ^ dm_b;
   q[2] = (get_bit(tx_pattern, 2) ^ get_bit(tx_pattern, 1)) ^ dm_b;
   q[3] = (get_bit(tx_pattern, 3) ^ get_bit(tx_pattern, 2)) ^ dm_b;
   q[4] = (get_bit(tx_pattern, 4) ^ get_bit(tx_pattern, 3)) ^ dm_b;
   q[5] = (get_bit(tx_pattern, 5) ^ get_bit(tx_pattern, 4)) ^ dm_b;
   q[6] = (get_bit(tx_pattern, 6) ^ get_bit(tx_pattern, 5)) ^ dm_b;
   q[7] = (get_bit(tx_pattern, 7) ^ get_bit(tx_pattern, 6)) ^ dm_b;
  } result = 0;
  for (loop = 0; loop<8; loop++)
  {
    result = result | (q[loop] << loop);
  }
  return result;
} int receiver(int tx_pattern, int pattern_is_sync)
{
  int position, check1, check2;
  int syncs_found, character;
  static int shifter = 0;
  int syn1, syn2;

syncs_found = 0;
// print_binary(shifter, 10);
  //2 parts to this. First check that syncs don't appear. second
actually decode the pattern
  //Part 1, check for syncs
  for (position = 0; position < 10; position++)
  {
    shifter = shifter >> 1;
    //Shift the input data stream into the serial shifter
    if (get_bit(tx_pattern, position) == 1)
      shifter = shifter | 0x80000;
    //Check if a sync pair passes through
    check1 = shifter & 0x3ff;
    check2 = (shifter >> 10) & 0x3ff;
    syn1 = is_sync(check1);
    syn2 = is_sync(check2);
    if ((syn1 == 1) & (syn2 == 1))
    {
      //Ooops, two syncs found
      syncs_found = position + 1;
    }
```

Docket No.: TI-33399

```c
  }
  //Part 2, decode the character
  character = decode(tx_pattern, 0, pattern_is_sync);
  if (debug)
  {
    print_binary(shifter, 20);printf("\n");
  } if (pattern_is_sync == 1)
    return tx_pattern;
  else if (syncs_found != 0)
    return - syncs_found;
  else
    return character;
} void run_data()
{
  int tx_pattern;
  int loop;
  int new_data;
  int result;
  int new_data_delayed = 0;
  int input_data[] = {0x97, 0xbf, 0xa9, 0xea, 0x1, 0x5a, 0xd1, 0xd7,
0xb9, 0x75, -1};
  int millions = 0;
  int sending_sync = 0;
  int sending_sync_delayed = 0;

for (;;)
  {

//Send sync sequences every so often to make sure we go in and out
of sync correctly
    if (((loop & 0xff) >= 100) & ((loop & 0xff) <= 104))
      sending_sync = 1;
    else
    {
      //Generate some random data
      new_data = random_int(256);
      sending_sync = 0;
    }

//Calculate the transmitted 10 bit pattern for the current data
    tx_pattern = calc_tx_pattern(new_data, sending_sync);

//Check what the receiver would return
    result = receiver(tx_pattern, sending_sync_delayed);

if (result != new_data_delayed)
    {
      if (result < 0)
      {
        printf("Dual syncs found in stream at char %d million %d\n",
millions, loop);
        error_count++;
      }
```

Docket No.: TI-33399

```
      else if (sending_sync_delayed == 1)
      {
        if (tx_pattern != result)
        {
          printf("Sync pattern incorrectly decoded. Sent sync %x, received sync %x\n", tx_pattern, result);
          error_count++;
        }
      }
      else
      {
        printf("Expected %x, found %x\n", new_data_delayed, result);
        error_count++;
      }
      if (error_count > 10)
      {
        printf("Stopping due to excessive errors!!\n");
        exit(-1);
      }
    } sending_sync_delayed = sending_sync;

if (sending_sync == 0)
      new_data_delayed = new_data;

loop++;
    if (loop == 1000000)
    {
      millions++;
      printf("%d million\n", millions);
      loop = 0;
    }
  }
} int main(int argc, char* argv[])
{
  int seed;

if (argc == 2)
  {
    seed = atoi(argv[1]);
    printf("Seeding with %d\n", seed);
    srand(seed);
  } run_data();

return 0;
}
```

What is claimed is:

1. A method of expanding 8-bit video data to a 10-bit serial word comprising:

performing an exclusive OR operation on the LSB of the video data and a number defined by an INV bit to generate a serial word LSB;

performing an exclusive OR operation on the serial word LSB, the second LSB of the video data and the number define by the INV bit to generate the second LSB of the serial word;

performing an exclusive OR operation on the serial word second LSB, the third LSB of the video data and the number defined by the INV bit to generate the third LSB of the serial word;

performing an exclusive operation on the serial word third LSB, the fourth LSB of the video data and the number defined by the INV bit to generate the fourth LSB of the serial word;

performing an exclusive OR operation on the serial word fourth LSB, the fifth LSB of the video data and the number define by the INV bit to generate the fifth LSB of the serial word;

performing an exclusive OR operation on the serial word fifth LSB, the sixth LSB of the video data and the number define by the INV bit to generate the sixth LSB of the serial word;

performing an exclusive OR operation on the serial word sixth LSB, the seventh LSB of the video data and the number defined by the INV bit to generate the seventh LSB of the serial word;

performing an exclusive OR operation on the serial word seventh LSB, the eighth LSB of the video data and the number defined by the INV bit to generate the eighth LSB of the serial word;

setting the ninth LSB of the serial word to the number one; and setting the tenth LSB of the serial word to the number defined by the INV bit, wherein the number defined by the INV bit is '1' whenever a rogue character sequence occurs upon expanding the 8-bit video data to 10-bit serial word, and wherein the number defined by the INV bit is a '0' otherwise.

2. The method of expanding 8-bit video data to a 10-bit serial word according to claim 1 wherein the step of setting the tenth LSB of the serial word to the number defined by the INV bit, wherein the number defined by the INV bit is a '1' whenever a rogue character sequence occurs upon expanding the 8-bit video data to a 10-bit serial word, and wherein the number defined by the INV bit is a '0' otherwise comprises the step of setting the tenth LSB of the serial word to the number '1' whenever any character generates a reserved synchronization character upon encoding.

3. The method of expanding 8-bit video data to a 10-bit serial word according to claim 1 wherein the step of setting the tenth LSB of the serial word to the number defined by the INV bit, wherein the number defined by the INV bit is a '1' whenever a rogue character sequence occurs upon expanding the 8-bit video data to a 10-bit serial word, and wherein the number defined by the INV bit is a '0' otherwise further comprises the step of setting the tenth LSB of the serial word to the number '1' whenever a sequence of two adjacent synchronization characters appears in any position across a span of three consecutive stream characters.

4. The method of expanding 8-bit video data to a 10-bit serial word according to claim 1 further comprising the step of transmitting the 10-bit serial word across an interconnecting cable in a digital visual interface compliant system.

5. A method of expanding video data to a serial word comprising:

encoding a first bit of video data and a rogue character sequence removal bit to generate a first bit of the serial word;

encoding a second bit of video data, the first bit of the serial word, and the rogue character sequence removal bit to generate a second bit of the serial word;

encoding a third bit of video data, the second bit of the serial word, and the rogue character sequence removal bit to generate a third bit of the serial word;

encoding a fourth bit of video data, the third bit of the serial word, and the rogue character sequence removal bit to generate a fourth bit of the serial word;

encoding a fifth bit of video data, the fourth bit of the serial word, and the rogue character sequence removal bit to generate fifth bit of the serial word;

encoding a sixth bit of video data, the fifth bit of the serial word, and the rogue character sequence removal bit to generate sixth bit of the serial word;

encoding a seventh bit of video data, the sixth bit of the serial word, and the rogue character sequence removal bit to generate a seventh bit of the serial word;

encoding an eighth bit of video data, the seventh bit of the serial word, and the rogue character sequence removal bit to generate an eighth bit of the serial word;

setting a ninth bit of the serial word to the number '1'; and setting a tenth bit of the serial word to a number defined by the rogue character sequence removal (INV) bit, wherein the number defined by the INV bit is a '1' whenever a rogue character sequence occurs upon expanding the video data to a serial word, and wherein the number defined by the INV bit is '0' otherwise.

6. The method of expanding video data to a serial word according to claim 5 wherein the step of setting a tenth bit of the serial word to a number defined by the INV bit comprises the step of setting the tenth bit of the serial word to the number '1' whenever any character generates a reserved synchronization character upon encoding.

7. The method of expanding video data to a serial word according to claim 5 wherein the step of setting a tenth bit of the serial word to a number defined by the INV bit comprises the step of setting the tenth bit of the serial word to the number '1' whenever a sequence of two adjacent synchronization characters appears in any position across a span of three consecutive stream characters.

8. The method of expanding video data to a serial word according to claim 5 further comprising the step of transmitting the serial word across an interconnecting cable in a digital visual interface compliant system.

9. A method of expanding video data to generate a serial word suitable for transmission across an interconneting cable in a digital visual interface compliant system, the method comprising:

encoding a plurality of video data bits in a digital visual interface compliant word to generate all of the bits other than two most significant bits of a serial word;

setting the next to the most significant bit of the serial word to the binary digit '1'; and setting the most significant bit of the serial word to a number defined by a rogue character sequence removal (INV) bit, wherein the number defined by the INV bit is a binary digit '1' whenever a rogue character sequence occurs upon expanding the video data to a serial word, and wherein the number defined by the INV bit is a binary digit '0' otherwise.

10. The method according to claim 9 wherein the step of setting the most significant bit of the serial word to a number defined by the INV bit comprises the step of setting the most significant bit of the serial word to the number '1' whenever any character generates a reserved synchronization character upon encoding.

11. The method according to claim 9 wherein the step of setting the most significant bit of the serial word to a number defined by the INV bit comprises the step of setting the most significant bit of the serial word to the number '1' whenever a sequence of two adjacent synchronization characters appears in any position across a span of three consecutive stream characters.

12. A method of expanding video data to generate a serial word suitable for transmission across an interconnecting cable in a digital visual interface compliant system, the method comprising:

encoding a plurality of video data bits to generate all of the bits other than the two most significant bits of a serial word;

setting the next to the most significant bit of the serial word to the number '1'; and setting the most significant bit of the serial word to a number defined by a rogue character sequence removal (INV) bit, wherein the number defined by the INV bit is a '1' whenever a rogue character sequence occurs upon expanding the video data to a serial word, and wherein the number defined by the INV bit is a '0' otherwise, wherein the step of encoding a plurality of video data bits to generate all of the bits other than the two most significant bits of a serial word comprises the steps of:

encoding a first bit of video data and the rogue character sequence removal bit to generate a first bit of the serial word;

encoding a second bit of video data, the first bit of the serial word, and the rogue character sequence removal bit to generate a second bit of the serial word;

encoding a third bit of video data, the second bit of the serial word, and the rogue character sequence removal bit to generate a third bit of the serial word;

encoding a fourth bit of video data, the third bit of the serial word, and the rogue character sequence removal bit to generate a fourth bit of the serial word;

encoding a fifth bit of video data, the fourth bit of the serial word, and the rogue character sequence removal bit to generate a fifth bit of the serial word;

encoding a sixth bit of video data, the fifth bit of the serial word, and the rogue character sequence removal bit to generate a sixth bit of the serial word;

encoding a seventh bit of video data, the sixth bit of the serial word, and the rogue character sequence removal bit to generate an eighth bit of the serial word.

13. The method of expanding video data to generate a serial word according to claim 9 further comprising the step of transmitting the serial word across an interconnecting cable in a digital visual interface compliant system.

* * * * *